United States Patent
Buffa et al.

(10) Patent No.: US 10,228,414 B2
(45) Date of Patent: Mar. 12, 2019

(54) CAPACITIVE SENSOR TESTING (71) Applicant: Infineon Technologies AG, Neubiberg (DE)

(72) Inventors: Cesare Buffa, Villach (AT); Richard Gaggl, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 134 days.

(21) Appl. No.: 15/078,453

(22) Filed: Mar. 23, 2016

(65) Prior Publication Data
US 2017/0276723 A1    Sep. 28, 2017

(51) Int. Cl.
G01R 31/28 (2006.01)
G01D 5/24 (2006.01)

(52) U.S. Cl.
CPC ........... G01R 31/2829 (2013.01); G01D 5/24 (2013.01)

(58) Field of Classification Search
CPC .............................. G01R 31/2829; G01D 5/24
USPC ................................................... 324/750.01
See application file for complete search history.

(56) References Cited

U.S. PATENT DOCUMENTS

| 6,564,637 B1* | 5/2003 | Schalk | G01C 19/5614 73/1.38 |
|---|---|---|---|
| 2004/0064280 A1* | 4/2004 | Seip | B06B 1/0215 702/103 |
| 2004/0194532 A1* | 10/2004 | Lally | G01D 3/08 73/1.82 |
| 2013/0279717 A1 | 10/2013 | Reimann et al. | |
| 2014/0086433 A1* | 3/2014 | Josefsson | H04R 3/06 381/98 |
| 2016/0080879 A1* | 3/2016 | Wiesbauer | H04R 29/004 381/58 |

FOREIGN PATENT DOCUMENTS

WO     2015149871 A1     10/2015

OTHER PUBLICATIONS

Buffa, C. et al. "A Versatile Instrument for the Characterization of Capacitive Micro- and Nanoelectromechanical Systems." IEEE Transactions on Instrumentation and Measurement, vol. 61, No. 7, Jul. 2012. pp. 2012-2021.
Lemkin, M. et al. "A Three-Axis Micromachined Accelerometer with a CMOS Position-Sense Interface and Digital Offset-Trim Electronics." IEEE Journal of Solid-State Circuits, vol. 34, No. 4, Apr. 1999. pp. 456-468.
Wu, J. et al. "A Low-Noise Low-Offset Capacitive Sensing Amplifier for a 50-μg/√Hz Monolithic CMOS MEMS Accelerometer." IEEE Journal of Solid-State Circuits, vol. 39, No. 5, May 2004. pp. 722-730.

(Continued)

Primary Examiner — Melissa Koval
Assistant Examiner — Courtney McDonnough
(74) Attorney, Agent, or Firm — Eschweiler & Potashnik, LLC (57)    ABSTRACT

Sensor devices and methods are provided where a test signal is applied to a capacitive sensor. Furthermore, a bias voltage is applied to the capacitive sensor via a high impedance component. A path for applying the test signal excludes the high impedance component. Using this testing signal, in some implementations a capacity imbalance of the capacitive sensor may be detected.

19 Claims, 7 Drawing Sheets

(56) References Cited

OTHER PUBLICATIONS

Yazdi, N. et al. "Precision Readout Circuits for Capacitive Microaccelerometers." Sensors, 2004. Proceedings of IEEE, vol. 1, Oct. 24-27, 2004. doi: 10.1109/ICSENS.2004. 1426091. pp. 28-31.
Saukoski, M. et al. "Fully Integrated Charge Sensitive Amplifier for Readout of Micromechanical Capacitive Sensors." Circuits and Systems, 2005. ISCAS 2005. IEEE International Symposium, vol. 6, May 23-26, 2005. pp. 5377-5380.
Stanford Research Systems, "Model SR830: DSP Lock-In Amplifier." User guide. 2011. 178 pages.
Malcovati, P. et al. "Interface Circuits for MEMS Microphones." Chapter in Nyquist AD Converters, Sensor Interfaces, and Robustness book. Springer, 2012. pp. 1-25.

* cited by examiner

CAPACITIVE SENSOR TESTING

TECHNICAL FIELD

The present application relates to devices and methods related to testing of capacitive sensors.

BACKGROUND

Capacitive sensors, also referred to as capacitive transducers, respond to a physical quantity to be measured by a change of a capacitance of the sensor, which in turn may be detected by appropriate readout circuits. Examples of such capacitive sensors include pressure sensors or microphones. Recently, such capacitive sensors have increasingly been implemented as micro-electromechanical systems (MEMS), where the sensor itself together with additional circuitry may for example be implemented on a single silicon chip die. An implementation with two or more separate dies (e.g. one with a mechanical sensor and one with electronic circuitry). In such a case, the separated dies may e.g. be wire-bonded or connected with other techniques like through silicon via (TSV).

Such capacitive sensors typically include a movable membrane and one or more back plates, capacitances being formed between the membrane and the one or more back plates. The physical quantity to be measured, for example pressure or sound, causes the membrane to move, thus changing a capacitance between the membrane and the one or more back plates. In differential implementations, the membrane is arranged between two back plates, forming two capacitances. When the membrane moves, one of the capacitances (between the membrane and one of the back plates) increases, while another capacitance (formed between the membrane and the other one of the back plates) decreases. For reading out the sensor, a bias is applied to the capacitances. A change in the capacitances then causes an output signal.

Various general approaches exist for reading such capacitive sensors. A first approach is referred to as constant voltage biasing herein. In this approach, a bias voltage is kept constant, and change of capacitances cause a current to flow, which serves as the output signal. Another approach is referred to as constant charge biasing herein. Here, the capacitances are biased via a high impedance connection. When the capacitances change, the charge on the capacitances remains essentially constant at least on typical timescales of the capacitance variations, as due to the high impedance charge cannot leave the capacitances fast enough. This causes a generation of a voltage signal, which may be read out via high impedance amplifiers.

When manufacturing such capacitive sensors, capacitances may vary for example due to process variations. Furthermore, in case of differential sensors the capacitances, which in a rest position of the membrane mentioned above may have nominally equal values, may in fact have different values due to such process variations. For these and other reasons, it is desirable to test the sensor, for example to measure capacitances or a difference between capacitances.

Various approaches have been made for such measurements, which generally involve the application of a test signal to the sensor. While many of these approaches are quite suitable for sensors being used in constant voltage biasing schemes, they may not be fully suitable for constant charge biasing schemes. In particular, in constant charge biasing schemes the high impedances used, which may be in the GΩ range or higher, in practice act as filters with a comparatively slow time constant, which makes application of suitable test signals without disturbing the actual operation of the sensor difficult.

SUMMARY

According to an aspect, a sensor device is provided, comprising a capacitive sensor, and a voltage source configured to provide a bias voltage. The voltage source is coupled to a terminal of the capacitive sensor via a high-impedance component providing an ohmic resistance of at least 1 MΩ. The sensor device further comprises a test signal generator configured to provide a test signal, wherein the test signal generator is coupled to the terminal of the capacitive sensor via a path not comprising the high-impedance component.

According to another aspect, a method is provided, comprising applying a bias voltage to a terminal of a capacitive sensor via a high impedance component having an ohmic resistance of at least 1 MΩ, and applying a test signal to the capacitive sensor via a path excluding the high impedance component.

According to yet another aspect, a sensor device is provided, comprising a differential capacitive sensor comprising a first variable capacitance and a second variable capacitance, and a bias voltage source. The bias voltage source is coupled with a first terminal of a high impedance component, and a second terminal of the high impedance component is coupled with a node between the first variable capacitance and the second variable capacitance. The sensor further comprises a test signal generator, wherein an output of the test signal generator is coupled with a first terminal of an alternating current (AC) coupling capacitance, and a second terminal of the AC coupling capacitance is coupled with the second terminal of the first high impedance component. Still, further, the sensor device comprises a second high impedance component coupled between the first variable capacitance and a reference voltage, a third high impedance component coupled between the second variable capacitance and the reference voltage, a first high impedance amplifier coupled to the first variable capacitance, and a second high impedance amplifier coupled to the second variable capacitance.

The above summary is only intended to give a brief overview over some features of some embodiments and aspects and is not construed as limiting, as implementations may also have different features from the one discussed above.

DETAILED DESCRIPTION

In the following, various embodiments will be described in detail referring to the attached drawings. These embodiments are given by way of example only and are not to be construed as limiting. For example, while an embodiment may be described with numerous details, features or elements, this is not to be construed as indicating that all these details, features or elements are necessary for an implementation. Instead, in other embodiments, some of these details, features or elements may be omitted, and/or be replaced by alternative details, features or elements. Furthermore, in embodiments apart from the features or elements explicitly described or shown in the drawings additional features or elements may be provided, for example features or elements conventionally used in capacitive sensor devices.

Any connections or couplings shown in the drawings or described herein may be direct connections or couplings, i.e. connections or couplings without intervening elements (like simple metal wires or layers), or may also be indirect connections or couplings comprising one or more additional intervening elements, as long as the general purpose of the connection or coupling, for example to transmit a certain kind of information or a certain kind of signal or to perform a certain kind of control is essentially maintained. Features from various embodiments may be combined to form further embodiments unless mutually exclusive. Variations and modifications described for one of the embodiments may also be applicable to other embodiments.

Throughout the figures, like elements are designated with the same reference numerals, and corresponding description will not be repeated in detail for the sake of conciseness. This is not to be construed as indicating that all these features have to be implemented in exactly the same manner in the various embodiments.

While in some embodiments for illustration purposes numerical values are given as examples, these numerical values serve only further illustration purposes and are not to be construed as limiting, as values in an actual implementation may vary depending on implementation details.

The term circuit as used herein is not limited to a circuit comprising a plurality of circuit components, but may also refer to circuits having only a single component, e.g. a single capacitor.

Some embodiments relate to sensor devices using a constant charge biasing and voltage readout. As a prelude to the detailed description of some embodiments, with reference to FIG. 1 a sensor device with such a constant charge biasing will be explained to enable a better understanding of the environment where some embodiments may be implemented.

Figure 1:
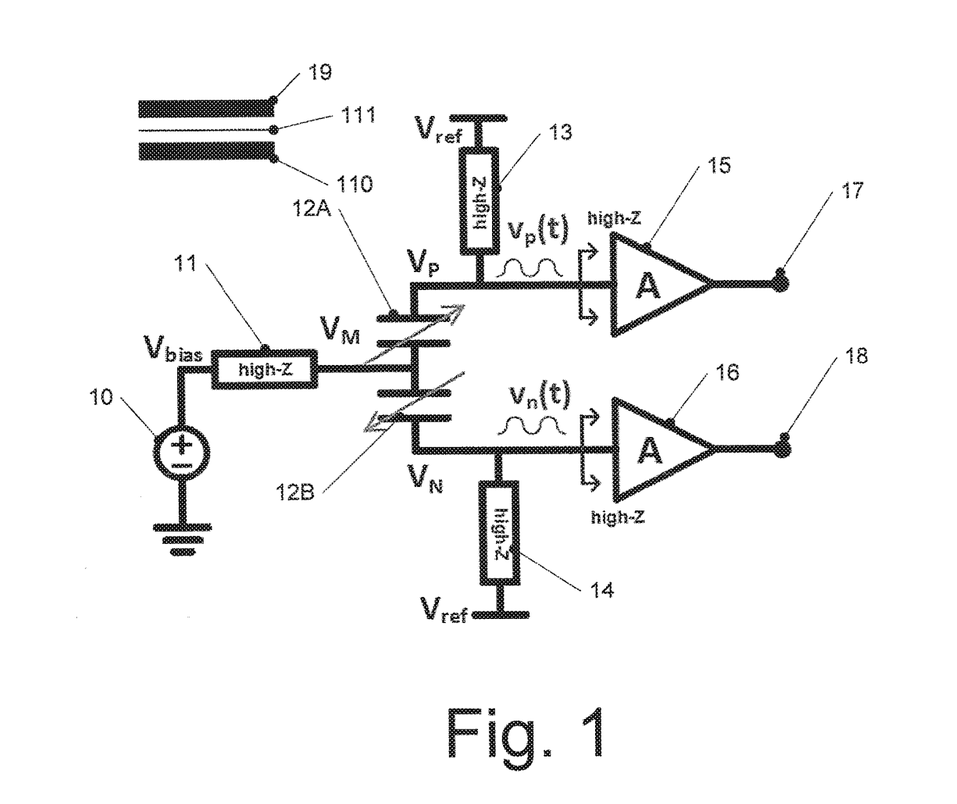
FIG. 1 is a diagram for explaining an application environment for embodiments.

A sensor device illustrated in FIG. 1 comprises a differential capacitive sensor, represented as variable capacitances 12A and 12B. Such a sensor may for example be a microphone or a pressure sensor. The sensor may be implemented as a micro-electromechanical system. In some embodiments, this allows implementation together with the circuitry shown in FIG. 1 or part thereof on a single silicon chip die. For instance, as shown in FIG. 1, the sensor may be implemented as having a movable membrane 111 between two back plates 19, 110. Capacitance 12A may for example be a capacitance between back plate 19 and membrane 111, and capacitance 12B may be a capacitance between back plate 110 and membrane 111. When membrane 111 moves due to the physical quantity to be measured, for example pressure or soundwaves, capacitances 12A, 12B change their values as membrane 111 is displaced. Other sensor implementations may also be used.

In the constant charge biasing scheme illustrated in FIG. 1, a node between capacitances 12A, 12B (for example membrane 111) is biased by a biasing voltage $V_{bias}$ generated by a voltage source 10 via a high impedance 11. High impedance 11 may for example have an ohmic resistance exceeding 1 MΩ, exceeding 10 MΩ or exceeding 100 MΩ, for example, on the order of 1 GΩ or higher. A resulting voltage at the node between capacitances 12A and 12B (for example a voltage at membrane 111) is labeled $V_M$ in FIG. 1.

$V_P$ designates a voltage at capacitance 12A (for example at back plate 19), and $V_N$ designates a voltage at capacitance 12B (for example back plate 110). Capacitance 12A is biased with a reference voltage $V_{ref}$ via a high impedance 13, and capacitance 12B (for example back plate 110) is biased with $V_{ref}$ via high impedance 14. High impedances 13, 14 each may have an ohmic resistance of at least one MΩ, for example 10 MΩ or more, 100 MΩ more, for example, on the order of one GΩ or even more (10 GΩ or some 100 GΩ).

A change of the capacitance due to a signal applied (for example a sound pressure causing a movement of membrane 111) leads to a change of voltage, schematically shown as $v_{p(t)}$ and $v_{n(t)}$ in FIG. 1. The voltages are amplified by amplifiers 15, 16 having a high impedance input. Output signals may be tapped at output 17, 18 and evaluated to determine the physical quantity (for example pressure or sound) measured.

During the measurement of the physical quantity, charge on capacitances 12A, 12B remains essentially constant at least on a time scale of the variations of $v_{p(t)}$ and $v_{n(t)}$, as the high impedances prevent a fast flowing of current (corresponding to a change of charge).

Generally, a current through a capacitor is given by the variation of its charge with respect to time.

$$I_C = \frac{dQ}{dt} = \frac{d(CV)}{dt} = \frac{dC}{dt} \cdot V + C \cdot \frac{dV}{dt} \quad (1)$$

In equation (1), $I_C$ is the current via the capacitor, Q is the charge of the capacitor, C is the capacitance of the capacitor and V is the voltage across the capacitor. A physical quantity to be measured causes a change in capacitance (dC/t≠0). In the constant charge biasing, no current flows ($I_C$=0), and therefore according to equation (1) a voltage change occurs (dV/dt≠0). Similarly, by varying the voltage, a change in capacitance can be caused.

In embodiments, as will be discussed below in more detail, to measure capacitances 12A, 12B independent of the physical quantity to be measured (for example for a rest position, where no sound is applied), an alternating current (AC) test signal needs to be applied to the node between capacitances 12A, 12B. However, providing such an AC test signal overlying $V_{bias}$ may be difficult due to a filtering effect of high impedance 11. Moreover, care has to be taken that the charge on the capacitances 12A, 12B remains essentially constant when applying the test signal so as not to disturb measurements of the physical quantity. Similar considerations apply to a test signal applied to $V_{ref}$, where high impedances 13, 14 together with capacitances 12A, 12B act as a low pass filter.

Figure 2:
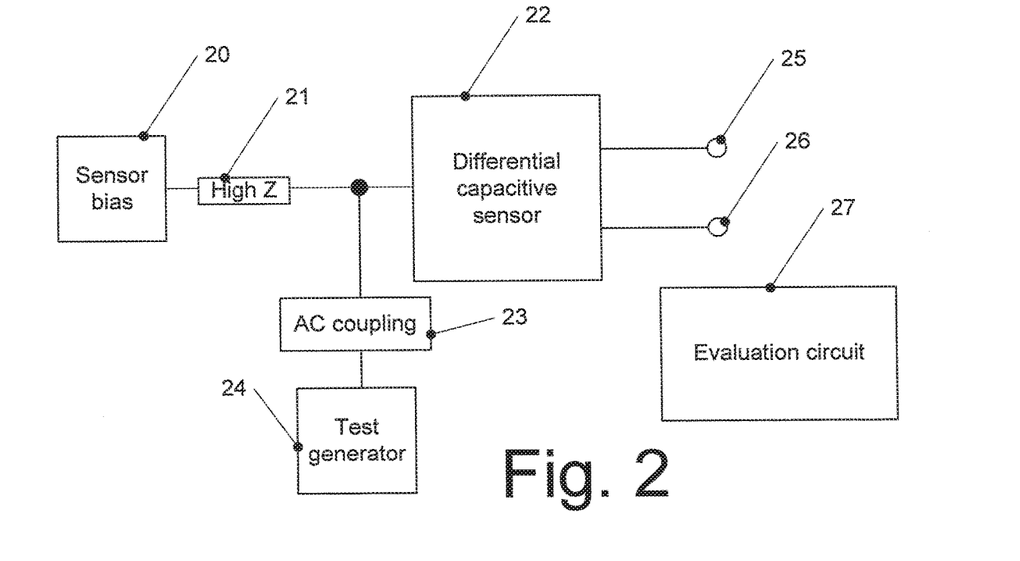
FIG. 2 is a schematic block diagram of a sensor device according to an embodiment.

FIG. 2 illustrates a sensor device according to an embodiment providing mechanisms for how such a test signal may be applied.

The sensor device of FIG. 2 comprises a differential capacitive sensor 22, for example as represented by capacitances 12A, 12B and/or as explained with reference to 19, 110 and 111 in FIG. 1. The differential capacitive sensor 22, for example a membrane or middle node between capacitances thereof, is biased by a sensor bias circuit 20 via a high impedance 21. High impedance 21 may be for example 1 MΩ or more, 10 MΩ or more, 100 MΩ or more or even in the GΩ range.

Outputs of the differential capacitive sensor 22 (for example $V_P$, $V_N$ in FIG. 1) are labeled 25 and 26 in FIG. 2.

The device of FIG. 2 additionally comprises a test signal generator 24, which applies test signals to a node between high impedance 21 and differential capacitive sensor 22 via an AC coupling 23. An AC coupling 23 is a coupling which blocks DC (direct current) signals, but lets AC (alternating current) signals pass at least to some extent. AC coupling 23 may for example be implemented using one or more capacitors.

In this way, a test signal may be applied to differential capacitive sensor 22 without high impedance 21 providing a low pass filtering.

The response of differential capacitive sensor 22 to the test signals generated by test generator 24 may then be evaluated via an evaluation circuit 27. Evaluation circuit 27 may for example be implemented as an application-specific integrated circuit (ASIC) or a specifically programmed microprocessor, but is not limited thereto. Evaluation circuit 27 in response to the evaluation may then for example calibrate differential capacitive sensor 22, may adjust a biasing voltage (for example as provided by sensor bias circuit 20) or may take other actions, for example store values for documentation purposes. Some details of this analysis and possibilities for responding to the analysis will be explained further below.

Figure 3:
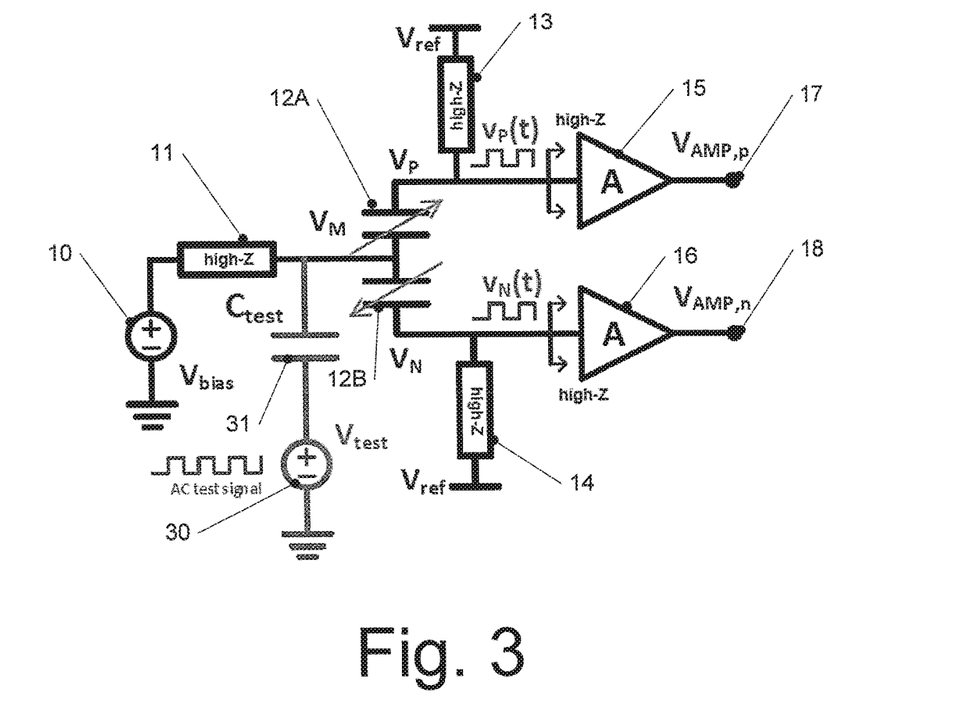
FIG. 3 is a circuit diagram of a sensor device according to an embodiment.

FIG. 3 illustrates a further embodiment of a sensor device. The sensor device of FIG. 3 is based on the sensor device of FIG. 1, and to avoid repetitions like elements bear the same reference numerals and will not be described again in detail.

In addition to the components already discussed and described with reference to FIG. 1, the sensor device of FIG. 3 comprises a test signal generator 30 which generates an AC test signal. The AC test signal may for example be an essentially rectangular signal as illustrated in FIG. 3, which may be easily generated using at least in part digital circuitry. However, test signals usable in embodiments are not limited to the waveform shown in FIG. 3, but other waveforms, for example sinusoidal waveforms, may also be used.

The test signal generated by test signal generator 30, which corresponds to a test voltage $V_{test}$, is applied to the node between capacitances 12A and 12B via an AC coupling implemented by a capacitance 31, also labeled $C_{test}$. In particular, the test signal is applied between high impedance 11 and the node between capacitances 12A and 12B as shown in FIG. 3, such that filtering due to high impedance 11 is not a significant issue for the application of the AC test signal. When applying the AC test signals, the voltages $V_P$, $V_N$ exhibit a temporal behaviour in response thereto as also schematically illustrated in FIG. 3 for $V_P(t)$ and $V_N(t)$. These responses to the test signals may be read out via amplifiers 15, 16. Therefore, in the embodiment of FIG. 3 amplifiers 15, 16 are used both for testing purposes and for normal readout of the sensor when sensing the desired physical quantity, as illustrated in FIG. 3. While a simplified circuit diagram is shown in FIG. 3 where amplifiers 15, 16 are used for readout, any conventional readout schemes, for example conventional switched capacitor readout schemes, may be used in embodiments. A demodulation circuit (for example evaluation circuit 27 of FIG. 2) may be output coupled to outputs of amplifiers 15, 16, i.e. to terminal 17, 18 to evaluate signals $v_{p(t)}$ and $v_{N(t)}$, which may for example involve a demodulation based on the AC test signal. In particular, in one embodiment the AC test signals may be generated using a crystal oscillator or other on-chip reference oscillator which is used for example for clocking purposes. A CMOS driver or chain of CMOS drivers may then be used to provide an AC test signal with sufficient strength, as desired. The demodulation circuitry may be based on switched capacitors.

The test signal so generated may be CMOS compatible and can be derived from an oscillator available on chip, which is indeed the case in most chips. For example, conventionally such oscillator may be used for start-up/timing/clocking purposes, for example to clock a charge pump. The test signal due to capacitance 31 is shifted at a higher voltage at node $V_M$.

In particular, capacitances 12A, 12B serve as a capacitive divider dividing the applied test signal to signals $v_P(t)$ and $v_N(t)$. In case capacitances 12A, 12B have the same value, signals $v_P(t)$ and $v_N(t)$ should be equal. In case of different capacitances, the signals are not equal.

Figure 4:
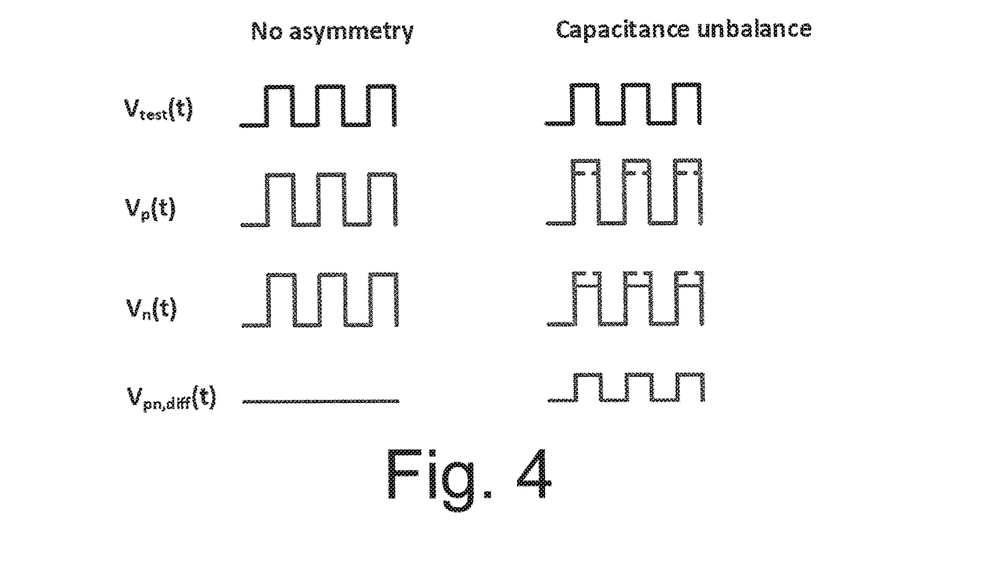
FIG. 4 shows schematic example signals to illustrate operation of some embodiments.

This is illustrated in FIG. 4. FIG. 4 shows example signals for a case of no asymmetry (capacitances 12A, 12B equal; left column of signals in FIG. 4) and for unequal capacitances 12A, 12B (right column of signals in FIG. 4). It should be noted that the signals illustrated in FIG. 4 serve merely as simplified examples for explaining some principles underlying some embodiments, and actual signal waveforms may differ.

The applied test signal (first line in FIG. 4) is equal for both cases. In the case of no asymmetry, signals $v_p(t)$ and $v_n(t)$ are equal, and a difference between the signals $v_{pn,diff}(t)$ (last line in FIG. 4) is zero. In contrast, in case of a capacitance unbalance the signals $v_p(t)$ and $v_n(t)$ are unequal (solid lines in the right column of FIG. 4; dashed lines show the signals of the left column for reference), and the difference signal $v_{pn,diff}(t)$ is different from zero at least a part of the time. In this way, a capacitance unbalance for example due to manufacturing tolerances may be detected. Applications of such measurements will be discussed later.

In some embodiments, the circuit shown in FIG. 3 may be fully implemented by a standard CMOS (complementary metal oxide silicon) process. In other embodiments, other manufacturing processes may be used. In some cases, a comparatively large capacitance, for example of the order of 5 pF, may be necessary as capacitance 31 to be able to apply the test signal with sufficient accuracy and strength. As such capacitances need a comparatively large circuit area (for example of the order of 200 μm×200 μm), in some embodiments it may be implemented as an external capacitance. In other embodiments, a capacitance used in a charge pump may additionally be used as capacitance 31, such that no additional capacitance is needed.

For example, in many applications the voltage $V_M$ needs to be comparatively high (for example of the order of 9 to 11 V), and therefore the bias voltage $V_{BIAS}$ also needs to be in this range. Such voltages are higher than usual CMOS supply voltages, which typically are for example 5 V, 3.3 V or below. To generate such high voltages, bias voltage generator 10 may comprise a charge pump converting the standard supply voltage to the higher voltage needed for biasing. Such charge pumps usually need high capacitances. One of these capacitances then additionally may be used as capacitance 31 to provide an AC coupling for the signal. A switch may be provided to couple this capacitance to the test signal generator 30 and capacitances 12A, 12B (i.e. to the sensor) when testing is needed. In particular, such a capacitance is used conventionally in charge pumps to smooth the charge pump output, as otherwise the charge pump has a residual ripple which would be a noise contribution in the output signal. Because of the high impedance 11, such a capacitance is often in the order of some tens of pF to have a pole below the audio bandwidth, and therefore may be used as capacitance 31 as well.

Figure 5:
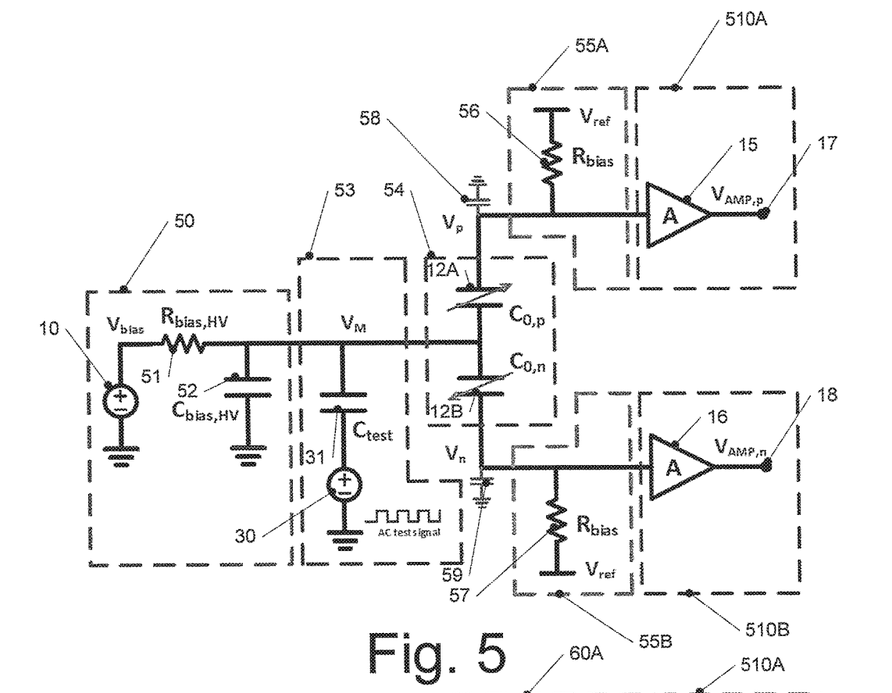
FIG. 5 is a circuit diagram of a sensor device according to an embodiment.

FIG. 5 illustrates a sensor device according to a further embodiment.

In FIG. 5, a more detailed implementation is illustrated which is based on the embodiment of FIG. 3, and like elements again bear the same reference numerals. Numeral 50 generally designates a part responsible for a high voltage high-ohmic biasing of a sensor 54 with capacitances 12A, 12B. Part 50 comprises bias voltage source 10, which as already discussed may be implemented using a charge pump. To provide a high impedance coupling to sensor 54, a resistor 51, for example with an ohmic resistance of 1 MΩ or more, 10 MΩ or more, 100 MΩ or more or even in the GΩ range, and a biasing capacitance 52 coupled as shown are provided. Resistor 51 and capacitance 52 form an example for high impedance 11 of FIG. 3. Other implementations are also possible.

Numeral 53 generally designates a circuit part for the application of a test signal, which as already discussed with reference to FIG. 3 comprises a test signal source 30 and a capacitance 31. Capacitance 31, as already explained, may be a capacitance also used in a charge pump of bias voltage generator 10.

Numerals 55A and 55B designate biasing stages for capacitances 12A, 12B, for example for back plates of sensors as explained with reference to FIG. 1 (for example back plates 19, 110). They comprise high-ohmic resistors 56, 57 (for example having an ohmic resistance of 1 MΩ or more, 10 MΩ or more, 100 MΩ or more or even in the GΩ range), which are examples for high impedance elements 13, 14, respectively, of FIG. 3. Numerals 510A and 510B generally designate high input impedance amplifier stages of the circuit, which are implemented with amplifiers 15, 16 having output 17, 18, respectively, as already discussed with reference to FIG. 3.

Furthermore, in FIG. 5 parasitic capacitances 58, 59 are illustrated. Such parasitic capacitances may include active parasitics of input stages of amplifiers 15, 16 (for example gate capacitances of input transistors), parasitics for example between the back plates of sensor 54 and a substrate, and/or parasitics for example caused by wire bondings. Such parasitic capacitances influence the voltage divider which as explained previously is formed by capacitances 12A, 12B. Asymmetries caused by such parasitic capacitance may also be detected in the way illustrated with respect to FIG. 4. Such parasitic capacitances may also be caused by a dual chip solution, where for example sensor 54 and other parts of circuitry are provided on separate chip dies. Such parasitic capacitances are usually well-controlled in assembly. However, an offset caused by these capacitances may be measured as explained with reference to FIG. 4, and compensated for by calibration.

Figure 6:
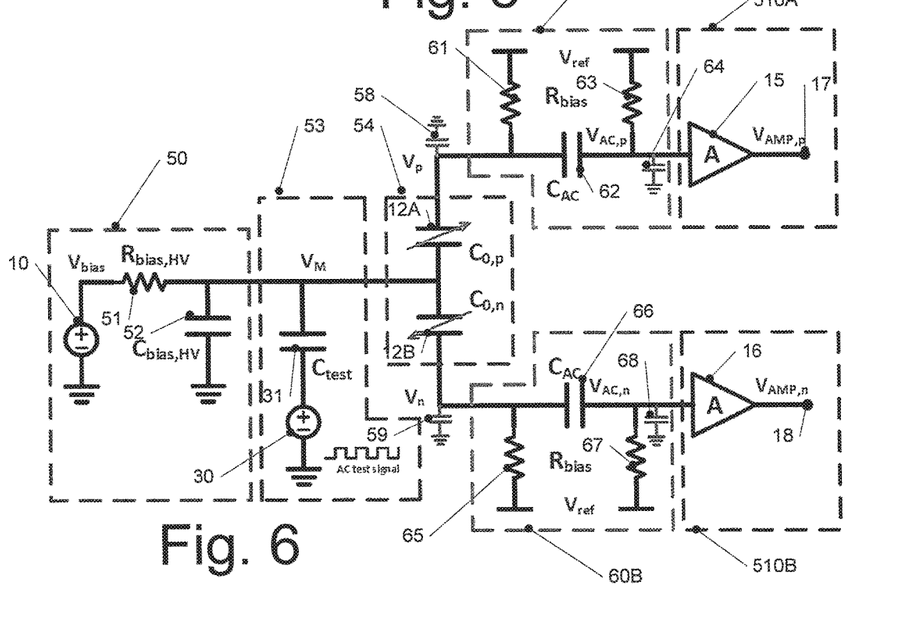
FIG. 6 is a circuit diagram of a sensor device according to an embodiment.

In the embodiment of FIG. 5, a DC coupling to the amplifying stages 510A, 510B (also referred to as front end or part thereof) is provided. In other embodiments, an AC coupling may be provided. An example for a sensor device with such an AC coupling is shown in FIG. 6. In FIG. 6, biasing stages 55A, 55B have been replaced by biasing stages 60A, 60B, respectively. Otherwise, the embodiment of FIG. 6 corresponds to the embodiment of FIG. 5, and therefore only the biasing stages 60A, 60B will be discussed in detail to avoid repetitions.

In FIG. 6, each of biasing stages 60A, 60B comprises two biasing resistors 61, 63 coupled to the reference voltage $V_{ref}$ in case of biasing stage 60A and two biasing resistors 65, 67 coupled to $V_{ref}$ in case of biasing stage 60B. Resistors 61, 63, 65 and 67 each may have an ohmic resistance of one MΩ or more, 10 MΩ or more, 100 MΩ or more or even in the GΩ range. Furthermore, AC coupling capacitors 62, 66 are provided which provide an AC coupling between sensor 54 and amplifier stages 510A, 510B. AC coupling in this respect means in particular, as explained previously for the AC coupling provided by capacitor 31, that DC signals are essentially blocked. Numerals 64, 68 designate parasitic capacitances.

Capacitance values $C_{AC}$ of capacitors 62, 66 are in the range of a few pF and are therefore negligible when in series with the parasitic capacitances 64, 68 representing input parasitics of amplifiers 15, 16. Capacitances 64, 68 may have capacitance values on the order of a few hundreds of fF. The value $C_{AC}$ of capacitors 62, 66 is in particular chosen such that typical audio signals in case of sensor 54 being a microphone (typically with a lower bound of 22-80 Hz) or other signals to be measured (for example pressure signals) are transmitted via capacitance 62, 66. In other words, capacitances 62, 66 essentially function as high pass filters, with a corner frequency such that the audio signals or other desired signals may pass.

As the capacitances 62, 66 have essentially negligible effect due to the parasitic capacitances as explained, the operation of sensor 54 and its readout, in particular the sensitivity of sensor 54, is not significantly altered by the AC coupled readout illustrated in FIG. 6 compared to the DC coupling of FIG. 5.

Figure 7A:
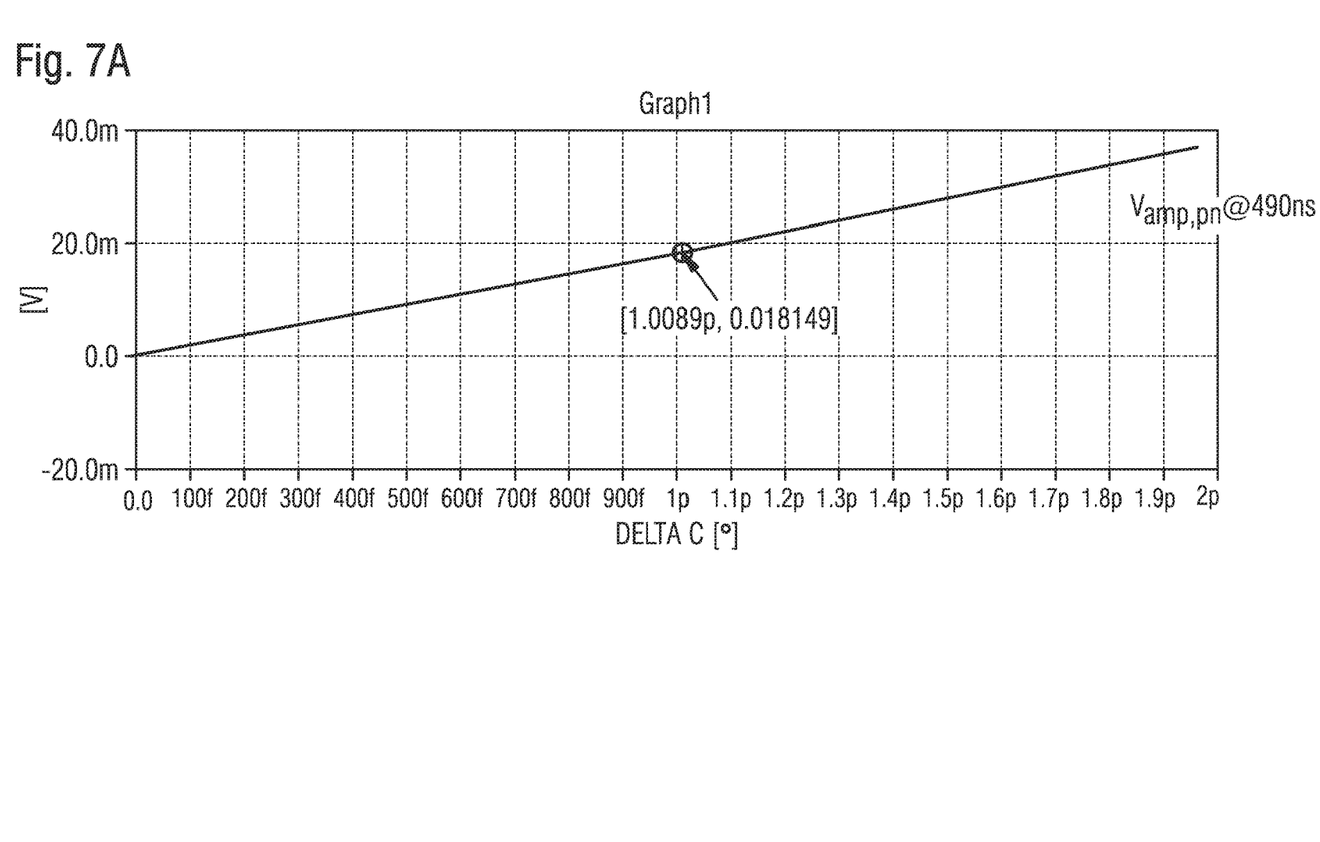
FIGS. 7A and 7B illustrate simulation results for an implementation.
Figure 7B:
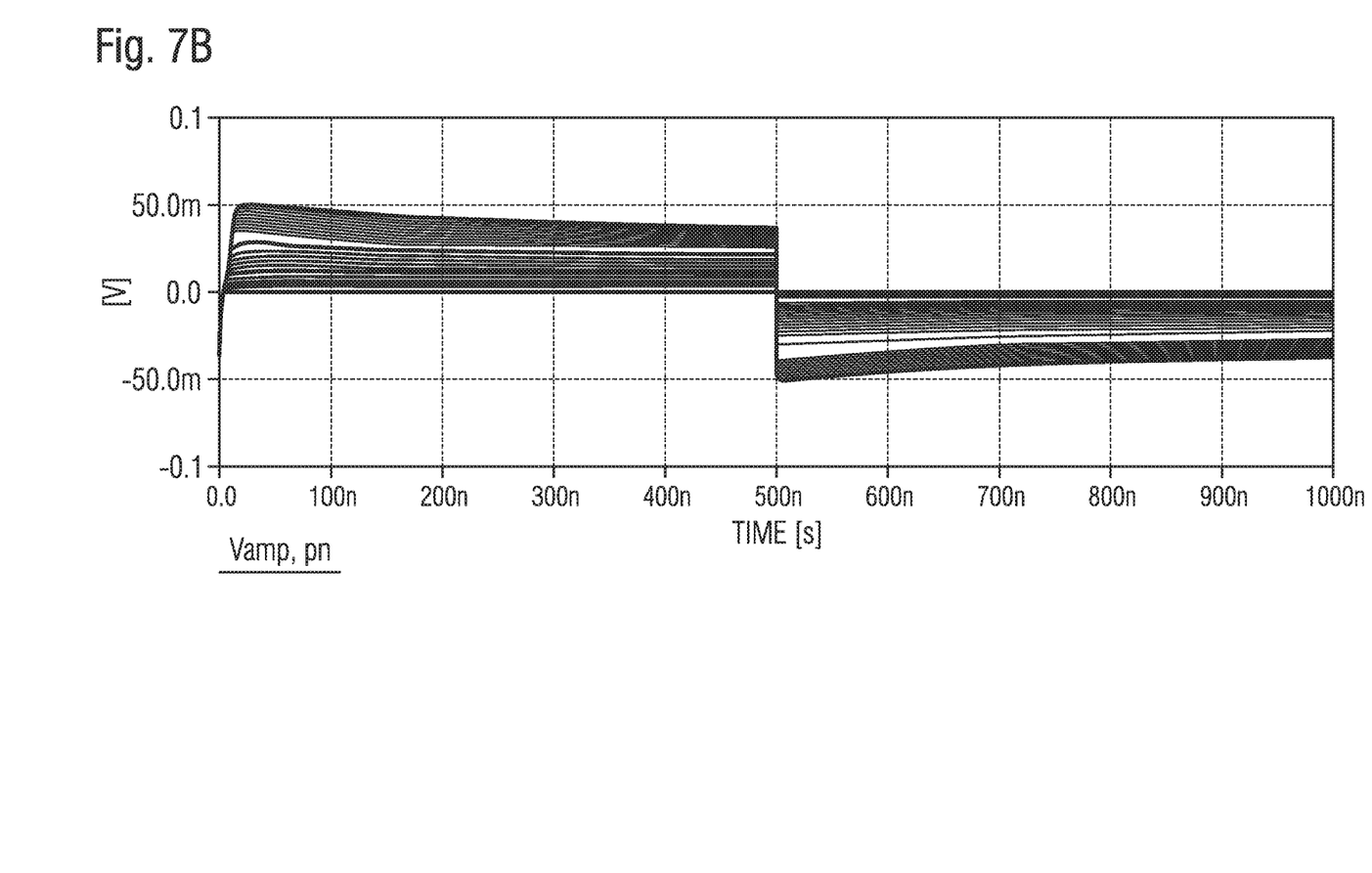

To illustrate operation of embodiments further, FIGS. 7A and 7B illustrate simulation results for an example device as disclosed above with varying imbalance between the two capacitances 12A, 12B in a rest position (i.e. without signal like sound or pressure to be measured). FIG. 7B illustrates curves for one cycle of a test signal for different imbalances. In the example shown in FIG. 7B, the cycle length (period) of the test signal is 1 μs. The curves in FIG. 7B illustrate the differential output signal (essentially corresponding to the signal of the last line of FIG. 4 $v_{pn,diff}(t)$ over one period.

FIG. 7A shows the values of the curve of FIG. 7B for a specific time, namely 499 ns, over capacity imbalance, i.e. difference between the capacitances. As can be seen, in the simulation example an essentially linear relationship exists. Therefore, the capacitance imbalance can be measured. It should be noted that the numerical values, period length etc. given in FIGS. 7A and 7B serve only for illustration purposes, and voltage value, time values etc. may vary depending on an actual implementation.

Therefore, as can be seen from FIGS. 7A and 7B, capacitance imbalances may be measured. These in turn may be used to determine sensor properties like a pull-in voltage and/or may be used for calibration purposes, which will be explained further with reference to FIGS. 8 and 9.

Figure 8:
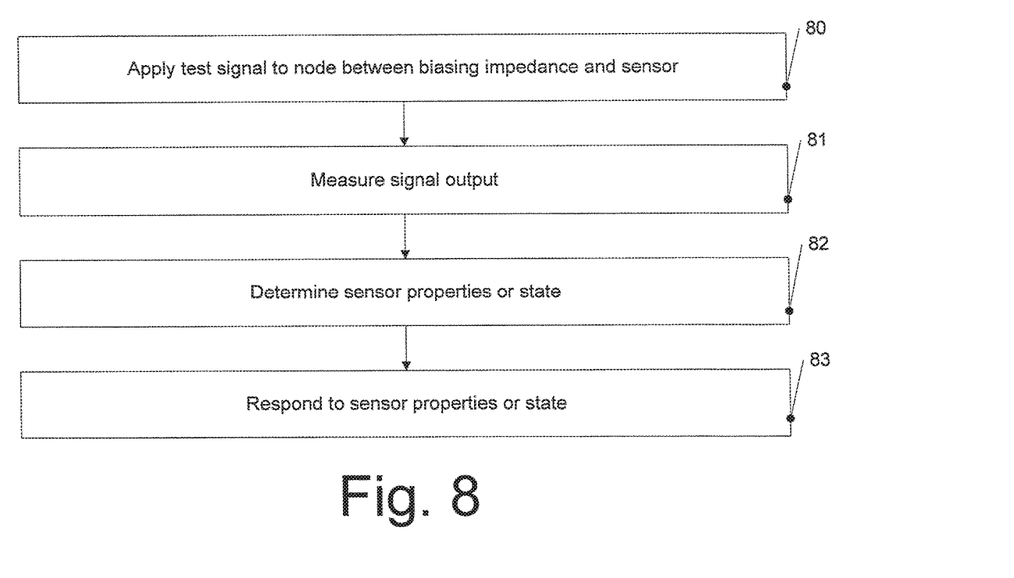
FIG. 8 is a flowchart of a method according to an embodiment.

FIG. 8 is a flowchart illustrating a method according to an embodiment. The method of FIG. 8 may for example be implemented using the sensor devices discussed previously, and execution of the method of FIG. 8 may be controlled by a controller like evaluation circuit 27 of FIG. 2. However, the method of FIG. 8 may also be applicable to other sensor devices. Furthermore, while the method of FIG. 8 is represented as a series of acts or events, the order in which these acts or events are presented and shown is not to be construed as limiting. For example, some of the acts or events may be performed simultaneously by different circuit parts, and/or may be performed repeatedly or continuously.

At 80, a test signal is applied to a node between a biasing impedance, in particular a biasing impedance having an ohmic resistance of more than one MΩ as discussed above, and a sensor. In particular implementations, the test signals may be applied to a node between a biasing impedance and a node between two capacitances of a differential capacitive sensor, for example a movable membrane between two back plates as discussed previously. The test signal in embodiments is applied via an AC coupling. Using an AC coupling may prevent a discharge of the nodes in form of a DC current.

At 81, the signal output of the sensor is measured. For example, signals $v_p(t)$ and $v_n(t)$ may be measured as discussed with reference to FIGS. 3 and 4. At 82, sensor properties or a state of the sensor may be determined based on the signal output. For example, a capacitance imbalance may be determined as discussed with reference to FIGS. 7A and 7B, or a pull-in voltage may be determined. A pull-in voltage is a voltage for a biasing (for example $V_{bias}$ in the previously discussed embodiments) where the sensor structure collapses due to electrostatic forces, for example by the membrane being pulled to one of the back plates. When the pull-in voltage is reached, sensitivity of the sensor decreases. On the other hand, for many implementations the sensitivity keeps increasing towards the pull-in voltage, such that to obtain a high sensitivity in some cases it may be desirable to select a bias voltage only slightly below the pull-in voltage.

The pull-in voltage may be detected by the method of FIG. 8 by sweeping the bias voltage (for example from 0 upward) and performing the operations described with respect to 80 and 81 repeatedly. As when the pull-in voltage is reached the membrane is for example drawn to one of the back plates, at this point the capacity imbalance increases significantly. Therefore, by monitoring the capacity imbalance during the sweep the pull-in voltage may be detected.

The pull-in voltage may vary depending on the processing conditions for manufacturing the respective sensors (process variations) or may also vary depending on other parameters. This will be explained now referring to FIG. 9.

Figure 9:
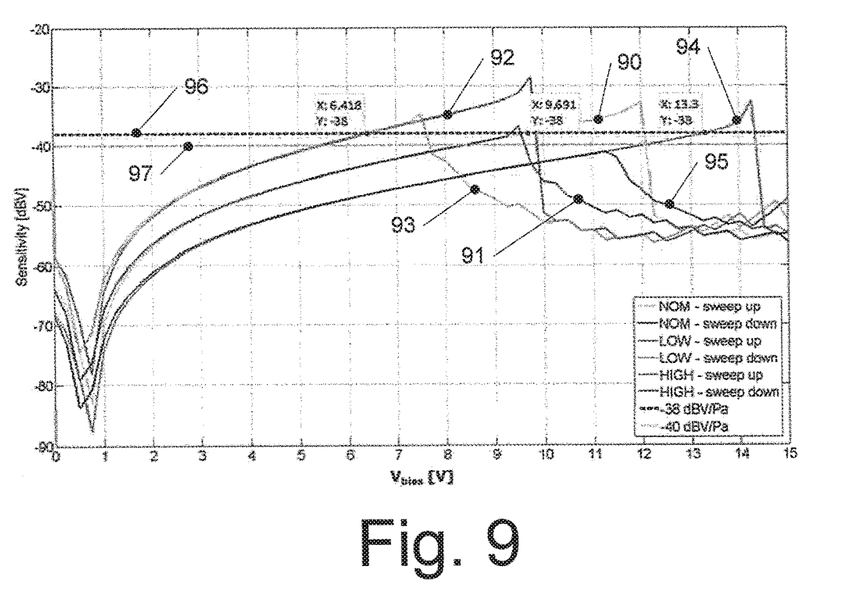
FIG. 9 illustrates example sensitivity curves for explaining some features of some embodiments.

FIG. 9 illustrates the sensitivity of an example sensor over bias voltage of the different sensor types. Curves 90 and 91 relate to a sensor device having nominal properties (i.e. as designed), curves 92 and 93 are example curves for a case where the pull-in the voltage due to process variations is significantly lower, and curves 94 and 95 show an example case where due to process variations the pull-in voltage is significantly higher.

Line 96 designates a sensitivity of −38 dBV/Pa (decibel Volts per Pascal), and a line 97 marks a sensitivity of −40 dBV/Pa.

Curves 90, 92 and 94 show the sensitivity when the bias voltage $V_{bias}$ is ramped up from 0 V to 15 V. In each case, at a particular voltage a rapid drop occurs, for curve 90 about 12 V, for curve 92 at about 10 V and for curve 94 at about 14.2 V. This corresponds to the pull-in voltage, where the structure collapses and therefore the sensitivity drops significantly. Curves 91, 93 and 95 show the case when the bias voltage is again ramped down from 15 V to 0 V. The sensitivity is restored only at a voltage below the pull-in voltage due to hysteresis effects. The voltage where the sensitivity again reaches the value before the pull-in may be referred to as release voltage. This voltage, when sweeping and measuring the capacitance imbalance as discussed with reference to FIG. 8, may be detected by a significant decrease of capacitance imbalance.

Furthermore, in FIG. 9 coordinates are marked (X being the bias voltage and Y being the sensitivity) where the sensitivity reaches or is at −38 dBV/Pa. As can be seen, the corresponding bias voltages vary significantly.

Returning now to FIG. 8, at 83 some response to the sensor properties or sensor state (for example detected pull-in state) may be made. For example, if a pull-in state is detected at 82, the voltage may be set to the release voltage explained with reference to FIG. 9 to restore the sensitivity. If a capacitance imbalance at rest position is detected, this may be used for calibration purposes, for example to compensate an offset caused by the capacitance imbalance. Furthermore, by measuring the pull-in voltage as described with reference to FIG. 9, a biasing voltage may be set slightly below the pull-in voltage, for example 1 V or 2 V below the pull-in voltage, to ensure a high sensitivity and/or high signal-to-noise ratio. Providing a higher biasing voltage increases the signal-to-noise ratio (SNR), because a higher voltage drop across the sensor capacitance ($V_{bias}-V_{ref}$), which leads to a higher signal amplitude generated by the sensor. Therefore, for a fixed amount of noise the signal-to-noise ratio is higher for a higher biasing voltage. By measuring the pull-in voltage and setting the biasing voltage slightly below the pull-in voltage, signal-to-noise ratio of the respective sensor may be optimized.

In conventional approaches, the biasing voltage has to be set such that the pull-in voltage is not reached regardless of the respective pull-in voltage of the respective sensor (which as explained above may vary due to process variations or other factors). For example, in case of FIG. 9 the biasing voltage in a conventional approach may be set to 8 V to be surely below the pull-in voltage for all cases, which, however, leads to a comparatively low sensitivity for sensors behaving according to curves 94, 95. Such setting of the biasing voltage may for example be controlled by an evaluation circuit like evaluation circuit 27 of FIG. 2. If the biasing voltage is set between the release voltage and the pull-in voltage, at high signal strength to be measured (for example high sound pressures in case of a microphone), pull-in may occur. This pull-in again may be detected by the measurement methods discussed above, and the release voltage may then be applied to reset the microphone.

In other embodiments, a self-calibration may be performed by a self-calibration routine which sweeps the biasing voltage and for each step measures the sensitivity, and the bias voltage is then programmed to a value according to a target sensitivity, for example −38 dBV/Pa in the example of FIG. 9, to ensure that all sensors have the same sensitivity.

Such offsets may also be due to fabrication residual stresses in micro-machined sensors.

It should be noted that test measurements as discussed above may also be run in the background while the sensor is actually operating, for example while a microphone sensor is recording voice. For such applications, for example a frequency of the test signals may be selected to be outside a range of the signal to be measured (for example outside a voice frequency range in case of voice recording), and then filtering (low-pass filters/high-pass filters) may be used to separate the response of the sensor to the test signal from the response of the sensor to the signal caused by the physical quantity to be measured, for example soundwaves. This way, for example a pull-in during sound recording may be detected, and a reset may be triggered.

As mentioned above, due to the AC coupling (for example 23 of FIG. 2 or capacitor 31) for coupling the test signal, the bias voltage (for example $V_{bias}$) may be set to essentially any value without affecting the test measurements. This may be also used to measure the impact of varying $V_{bias}$ on capacitance imbalance, for example to an initial mechanical offset which causes electrostatic forces to be different.

In some implementations, sensor devices may have a so-called low impedance mode (low Z mode) where for example impedance 11 of FIG. 3 is bridged for start-up and fast settling. The testing scheme of the embodiments above is also compatible with such a low Z mode.

As evident from the above descriptions of various embodiments, alternatives and modifications, the present application is not to be limited to any particular embodiment, and the embodiments are given as examples only.

What is claimed is:

1. A sensor device, comprising:
   a capacitive sensor,
   a voltage source circuit configured to provide a bias voltage,
   wherein the voltage source circuit is coupled to a terminal of the capacitive sensor via a high-impedance component providing an ohmic resistance of at least 1 MΩ,
   a test signal generator circuit configured to provide a test signal wherein the test signal generator circuit is coupled to the terminal of the capacitive sensor via a path not comprising the high-impedance component,
   an evaluation circuit configured to evaluate a response of the capacitive sensor to the test signal, wherein the evaluation circuit is configured to determine a capacitance imbalance of the capacitive sensor based on the response; and
   a bridge circuit coupled in parallel with the high-impedance component, and configured, in a low-impedance mode, to couple the voltage source circuit to the terminal of the capacitive sensor via a connection excluding the high-impedance component.

2. The sensor device of claim 1, wherein the path comprises an alternating current (AC) coupling circuit configured to block direct current (DC) signals.

3. The sensor device of claim 2, wherein the AC coupling circuit comprises a capacitance.

4. The sensor device of claim 3, wherein the voltage source circuit comprises a charge pump circuit comprising the capacitance of the AC coupling circuit.

5. The sensor device of claim 1, wherein the capacitive sensor is a differential sensor comprising a first variable capacitance and a second variable capacitance, wherein the terminal of the capacitive sensor is coupled to a node between the first variable capacitance and the second variable capacitance.

6. The sensor device of claim 5, wherein the capacitive sensor comprises a movable membrane arranged between a first back plate and a second back plate, wherein the terminal of the capacitive sensor is coupled to the movable membrane.

7. The sensor device of claim 1, wherein the capacitive sensor comprises a differential output having a first output terminal and a second output terminal, the sensor device further comprising:
   a first further high impedance component having an ohmic resistance of at least 1 MΩ coupled between the first output terminal and a reference voltage,
   a second further high impedance component having an ohmic resistance of at least 1 MΩ coupled between the second output terminal and the reference voltage,
   a first amplifier coupled to the first terminal; and
   a second amplifier coupled to the second terminal.

8. The sensor device of claim 7, wherein the first and second amplifiers comprise high impedance input terminals.

9. The device of claim 7, further comprising AC coupling circuits between the first and second amplifiers and the first and second output terminals of the capacitive sensor, respectively.

10. The device of claim 1, wherein the evaluation circuit is configured to determine at least one of a pull-in voltage or a release voltage of the capacitive sensor based on the response.

11. A method, comprising:
   applying a bias voltage to a terminal of a capacitive sensor via a high impedance component having an ohmic resistance of at least 1 MΩ,
   applying a test signal to the capacitive sensor via a path excluding the high impedance component,
   setting a bias voltage based on a response of the capacitive sensor to the test signal, and
   entering a low-impedance mode in which the bias voltage applied to the terminal of the capacitive sensor excludes the high impedance component, wherein the low-impedance mode is entered via use of a bridge circuit coupled in parallel with the high-impedance component, wherein the bridge circuit, in the low-impedance mode, is configured to couple the bias voltage to the capacitive sensor via a connection excluding the high-impedance component.

12. The method of claim 11, wherein applying the test signal comprises applying the test signal via an AC coupling circuit.

13. The method of claim 11, further comprising determining a capacitance imbalance of the capacitive sensor based on a response of the capacitive sensor to the test signal.

14. The method of claim 11, further comprising calibrating the capacitive sensor based on a response of the capacitive sensor to the test signal.

15. The method of claim 11, further comprising:
   sweeping the bias voltage over a range of bias voltages, and
   determining at least one of a pull-in voltage and a release voltage based on a response of the capacitive sensor to the test signal during the sweeping.

16. A sensor device, comprising:
   a capacitive sensor,
   a voltage source circuit configured to provide a bias voltage,
   wherein the voltage source circuit is coupled to a terminal of the capacitive sensor via a high-impedance component providing an ohmic resistance of at least 1 MΩ,
   a test signal generator circuit configured to provide a test signal wherein the test signal generator circuit is coupled to the terminal of the capacitive sensor via a path not comprising the high-impedance component, wherein the path comprises an alternating current (AC) coupling circuit configured to block direct current (DC) signals, wherein the AC coupling circuit comprises a capacitance, and
   a bridge circuit coupled in parallel to the high-impedance component, and configured, in the low-impedance mode, to couple the voltage source circuit to the terminal of the capacitive sensor via a connection excluding the high-impedance component, the voltage source circuit comprising a charge pump circuit comprising the capacitance of the AC coupling circuit.

17. The method of claim 11, in association with a sensor device that comprises:

a capacitive sensor, a voltage source circuit configured to provide a bias voltage, wherein the voltage source circuit is coupled to a terminal of the capacitive sensor via a high-impedance component providing an ohmic resistance of at least 1 MΩ, a test signal generator circuit configured to provide a test signal wherein the test signal generator circuit is coupled to the terminal of the capacitive sensor via a path not comprising the high-impedance component, wherein the path comprises an alternating current (AC) coupling circuit configured to block direct current (DC) signals, wherein the AC coupling circuit comprises a capacitance, an evaluation circuit configured to evaluate a response of the capacitive sensor to the test signal, a bridge circuit coupled in parallel to the high-impedance component, and configured, in the low-impedance mode, to couple the voltage source circuit to the terminal of the capacitive sensor via a connection excluding the high-impedance component, the method further comprising measuring a physical quantity produced by the capacitive sensor, and wherein the physical quantity is measured concurrently while applying the test signal.

18. The method of claim 17, further comprising setting a bias voltage on the capacitive sensor based on a response of the capacitive sensor to the test signal, wherein the bias voltage value is based on a value determined by the evaluation circuit.

19. The method of claim 17, wherein while measuring the physical quantity a charge on the capacitive sensor remains constant on a time scale of variations of an output signal due to the test signal.

* * * * *